United States Patent [19]

Huber

[11] Patent Number: 5,208,819
[45] Date of Patent: May 4, 1993

[54] OPTICAL SOURCE WITH FREQUENCY LOCKED TO AN IN-FIBER GRATING RESONANTOR

[75] Inventor: David R. Huber, Warrington, Pa.

[73] Assignee: General Instrument Corporation, Hatboro, Pa.

[21] Appl. No.: 822,581

[22] Filed: Jan. 23, 1992

[51] Int. Cl.$^5$ ................................................. H01S 3/13
[52] U.S. Cl. ........................................ 372/32; 372/29; 372/38
[58] Field of Search ............................... 372/32, 29, 38

[56] References Cited

U.S. PATENT DOCUMENTS

| | | | |
|---|---|---|---|
| 4,912,716 | 3/1990 | Mead | 372/32 |
| 4,977,565 | 12/1990 | Shimosaka et al. | 372/32 |
| 5,119,391 | 6/1992 | Maeda et al. | 372/32 |
| 5,136,600 | 8/1992 | Fidric et al. | 372/32 |
| 5,150,372 | 9/1992 | Nourrcier | 372/38 |

OTHER PUBLICATIONS

T. Day, et al., "Active Frequency Stabilization of a 1.062-μm, Nd:GGG, Diode-Laser-Pumped Nonplanar Ring Oscillator to Less than 3 Hz of Relative Linewidth," *Optics Letters*, vol. 15, No. 4, pp. 221-223, (1990).

T. Day, et al., "Optical Geenration of Frequency Stable mm-Wave Radiation Using Diode Laser Pumped Nd:YAG Lasers for Visible and IR Photo Detector Calibration," Optical Society of American, Nov. 3-8, 1991.

*Primary Examiner*—Georgia Y. Epps
*Attorney, Agent, or Firm*—Barry R. Lipsitz

[57] ABSTRACT

A frequency stabilized optical signal source is provided. A laser produces an optical carrier at a wavelength λ. Feedback is provided to adjust the wavelength λ. In order to provide the feedback, a portion of the optical carrier is modulated by a periodic reference signal. An optical fiber with an in-fiber resonator is coupled to receive the modulated optical carrier. The resonator effects a phase and/or amplitude change between the modulated optical carrier and a sideband thereof at a resonant frequency of the resonator. The phase or amplitude change is detected and used to adjust the laser wavelength. In a preferred embodiment, a moire grating having a single resonant frequency is used as the in-fiber resonator. The feedback scheme can lock either to the carrier frequency itself, or to a selected sideband of the modulated optical carrier.

15 Claims, 1 Drawing Sheet

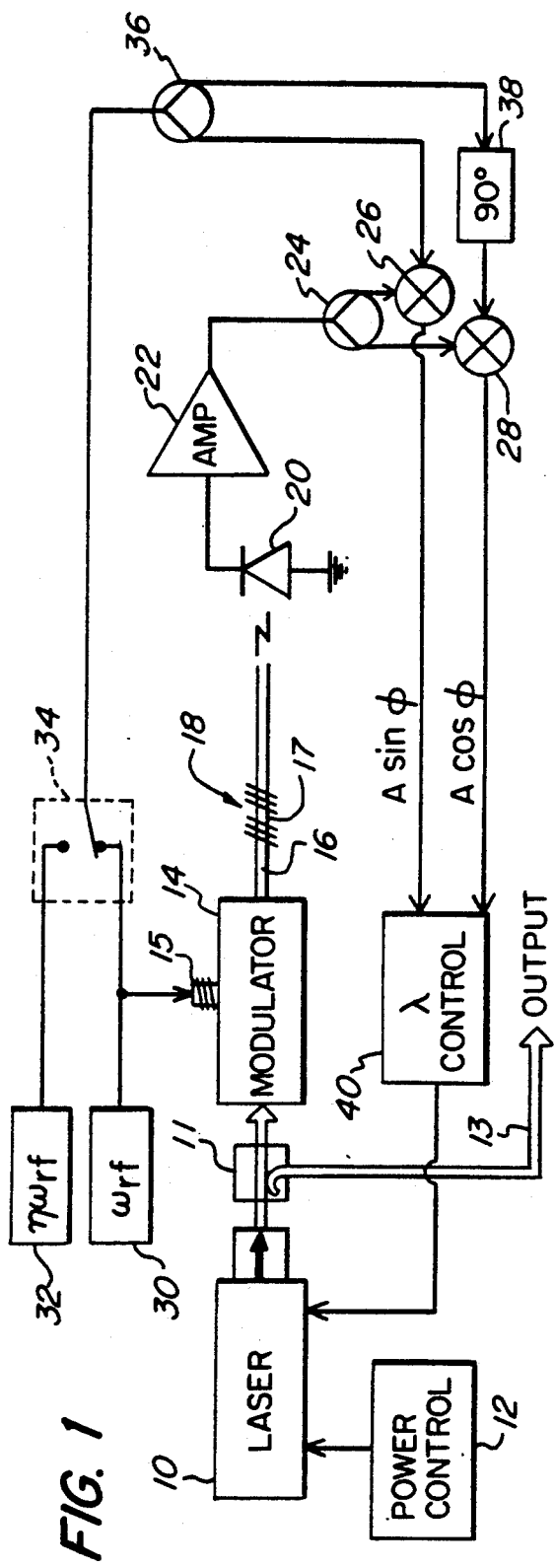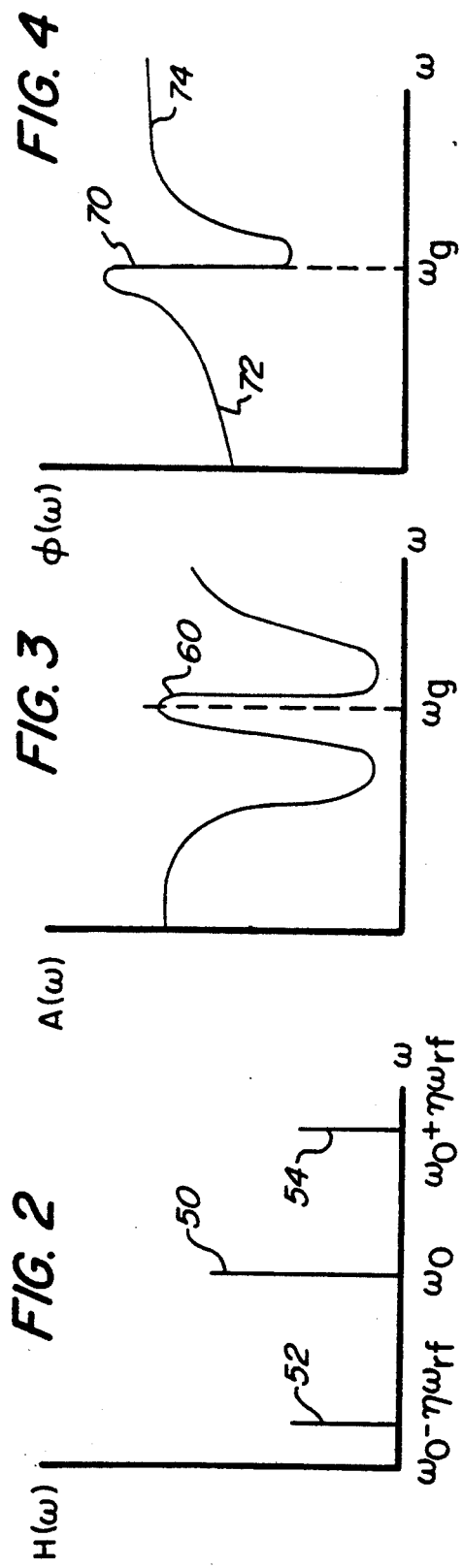

OPTICAL SOURCE WITH FREQUENCY LOCKED TO AN IN-FIBER GRATING RESONANTOR

BACKGROUND OF THE INVENTION

The present invention relates to optical sources for use in optical fiber communications or the like, and more particularly to an optical source that uses an in-fiber grating resonator to maintain a stable frequency.

Various communication systems, such as cable television (CATV) systems, currently distribute information signals via coaxial cable. The replacement of coaxial cable with optical fiber transmission lines in such communication systems has become a high priority. Production single mode fiber can support virtually unlimited bandwidth and has low attenuation. Accordingly, a fiber optic distribution system or a fiber-coax cable hybrid would provide substantially increased performance at a competitive cost as compared to prior art coaxial cable systems.

Frequency stable lasers are required as master oscillators in communication systems which have large numbers of lasers. Such lasers also have application to other fields, such as high resolution spectroscopy and gravity wave detection. Attempts have been made to provide frequency stable lasers in the past. For example, helium-neon, dye, and argonion lasers have been successfully stabilized for various applications. Such stabilized lasers are typically discrete element systems having wideband frequency noise, requiring complex locking servos. The use of reference interferometers has also been made to stabilize diode-laser-pumped Nd:YAG lasers. External elements are required in such lasers to force single axial mode operation and provide isolation against optical feedback.

The frequency stabilization of two diode-laser-pumped ring lasers that are independently locked to the same high finesse interferometer has been proposed by T. Day, E. K. Gustafson, and R. L. Byer in "Active Frequency Stabilization of a 1.062-$\mu$m, Nd:GGG, Diode-Laser-Pumped Nonplanar Ring Oscillator to Less than 3 Hz of Relative Linewidth," *Optics Letters*, Vol. 15, No. 4, pp. 221-223 (1990). This article discloses the measurement of relative frequency stability by locking the lasers one free spectral range apart and observing the heterodyne beat note. In a subsequent paper, a method for locking an optical source to a resonance in an external Fabry-Perot cavity was described. T. Day and R. A. Marsland, "Optical Generation of a Frequency Stable mm-Wave Radiation Using Diode Laser Pumped Nd:YAG Lasers for Visible and IR Photo Detector Calibration," Optical Society of America, Nov. 3-8, 1991. The use of an external Fabry-Perot cavity adds complexity and cost to the system design. Additionally, Fabry-Perot cavities as taught by Day, et al. have many resonant frequencies, making frequency stabilization more difficult since a system may lock to the wrong resonance.

It would be advantageous to provide a stabilized optical frequency source that is reliable, easy to manufacture, and very low in cost. Such a source would have particular application in the communication of information signals over an optical fiber network. The low cost of such a source would be of particular importance in consumer oriented communication systems, such as CATV systems. It would be still further advantageous to provide a frequency stabilized optical signal source with its optical frequency locked to an in-fiber grating resonator having a single resonance.

The present invention provides a frequency stabilized optical signal source having the aforementioned advantages.

SUMMARY OF THE INVENTION

In accordance with the present invention, a frequency stabilized optical signal source is provided. A laser produces an optical carrier at a wavelength $\lambda$. Means operatively associated with the laser are provided for adjusting the wavelength $\lambda$. The optical carrier is modulated by a periodic reference signal. An optical fiber is coupled to receive the modulated optical carrier from the modulating means. A resonator is provided within the optical fiber for effecting at least one of a phase change and amplitude change between the modulated optical carrier and a sideband thereof at a resonant frequency of the resonator. The phase and/or amplitude change is detected, and means responsive thereto control the laser wavelength adjusting means. In this manner, a phase or amplitude change caused by the resonator is used as a feedback signal to stabilize the optical frequency of the laser.

In a preferred embodiment, the resonator comprises a moire grating having a single resonant frequency. The controlling means lock the adjusting means to maintain $\lambda$ at a wavelength that coincides with the resonant frequency of the grating. In an alternate embodiment, the controlling means lock the adjusting means to maintain $\lambda$ at a wavelength where the frequency of a sideband of the modulated optical carrier coincides with the resonant frequency of the resonator.

The detecting means can comprise, for example, a heterodyne detector in which a signal representative of the modulated optical carrier is mixed with a local oscillator frequency to produce a signal indicative of the phase change. The local oscillator frequency can be the same as the periodic reference signal or can be a phase locked multiple of the periodic reference signal. By using a phase locked multiple of the periodic reference signal, a particular sideband can be chosen to resonate at the resonate frequency of the resonator, and thereby maintain the laser wavelength $\lambda$ at some desired frequency offset from the passive grating resonance.

The resonator can provide a unique signature when the phase or amplitude change occurs at resonance. This phenomena can be advantageously utilized by the detecting means, which can detect the phase or amplitude shift by identifying the unique signature produced by the phase or amplitude shift at the resonant frequency.

A plurality of local oscillators can be provided in the signal source of the present invention, each oscillator producing a different frequency. By providing means for coupling a selected local oscillator to the detecting means, a particular sideband of the modulated optical carrier can be chosen to maintain the wavelength $\lambda$.

In an illustrated embodiment, means are provided for splitting the optical carrier output from the laser into a first portion for input to the modulating means and a second portion for use as a stable optical signal. The second portion will advantageously comprise a substantial majority of the optical carrier power. Thus, only a small portion of the power output from the laser would be used for the frequency stabilizing feedback, while the majority of the power can be applied to the intended application for the signal source, such as the transmission of information signals over a communication network.

BRIEF DESCRIPTION OF THE DRAWINGS

FIG. 1 is a block diagram illustrating a signal source in accordance with the present invention, with optical fibers designated by double lines, and electrical conductors designated by single lines;

FIG. 2 is a frequency spectrum illustrating the center frequency and first sidebands of a modulated optical carrier output from modulator 14 of FIG. 1;

FIG. 3 is a graph illustrating the amplitude response or a moire grating 18 illustrated in FIG. 1; and FIG. 4 is a graph illustrating the phase response of moire grating 18 at resonance.

DETAILED DESCRIPTION OF THE INVENTION

FIG. 1 is a block diagram illustrating a frequency stabilized optical signal source in accordance with the present invention. A laser 10, for example, a DFB or semiconductor laser, outputs light at a wavelength $\lambda$ (optical carrier) for use in a desired application, such as carrying a communications signal via an optical fiber transmission link. A conventional power control 12 sets the output power of laser 10.

The optical carrier output from laser 10 is split in an optical coupler 11 to provide a small sample of the light to a modulator 14. The majority, e.g., 80 percent of the laser output, is coupled to an optical fiber 13. Fiber 13 carries the laser output signal for use in an intended application. For example, if the laser is to be used in a communication system, the light output from fiber 13 is used as an optical carrier and will be coupled to a modulator (not shown) that is used to modulate the carrier by an information signal, such as a plurality of television signals.

The small sample of the laser output power that is coupled to modulator 14 is used, in accordance with the present invention, to provide feedback for controlling and stabilizing the laser output frequency. Modulator 14 can comprise, for example, a conventional optical phase modulator. A periodic reference signal of frequency $\omega_{rf}$ is generated by RF generator 30, and input via RF terminal 15 to modulator 14. In this manner, the optical carrier output from laser 10 is modulated by the periodic reference signal $\omega_{rf}$, producing a modulated carrier having a spectrum as illustrated in FIG. 2. Specifically, the center frequency 50 ($\omega_0$) is the optical carrier frequency output by laser 10. The modulation will provide sidebands in a conventional manner, such as a sideband 52 at $\omega_0 - n\omega_{rf}$ and sideband 54 at $\omega_0 + n\omega_{rf}$.

The modulated carrier is coupled from modulator 14 to an optical fiber 16, for example conventional single mode fiber in which a resonator has been fabricated. In a preferred embodiment, the resonator comprises an in-fiber moire grating resonator 18. Such a resonator can be formed in a single mode fiber by a photo-refractive induced Bragg reflector, as taught by G. Meltz, W. W. Morey, and W. N. Glenn, *Opt. Lett.* 14, p. 823 (1989). Other techniques for forming in-fiber gratings are illustrated, for example, in C. M. Ragdale, D. C. J. Reid and I. Bennion, Paper WI1, OFC (1991).

In the embodiment illustrated in FIG. 1, moire grating 18 has a central gap 17 to facilitate formation of the resonator. In experiments with an in-fiber grating resonator of this type, an amplitude response 60 as illustrated in FIG. 3 was measured and a phase response as illustrated in FIG. 4 was obtained. Specifically, a grating length of about 22 nm was used with a 1 nm central gap 17. The resonant peak $\omega_g$ occurred at 1547.1 nm. The 3 dB optical bandpass was 4 GHz wide.

The optical phase and amplitude transmission response was measured by placing the resonator in one arm of a balanced heterodyne Mach-Zehnder interferometer. A laser was used to sweep through the grating resonance. The optical phase response was then down converted to the electrical domain and detected by RF heterodyne techniques.

As illustrated in FIG. 4, at the resonant frequency $\omega_g$ of the grating 18, a sudden phase shift occurred as illustrated at 70. Prior to $\omega_g$, the phase between the optical carrier and the sidebands remained essentially constant, as illustrated at 72. Similarly, after the resonant frequency a stable phase response is obtained as illustrated at 74. In accordance with the present invention, the unique signature 70 of the phase shift at resonance is detected and used in a feedback arrangement to stabilize the frequency of the laser output. Alternatively, the unique amplitude signature 60 illustrated in FIG. 3 can be detected and used in a feedback arrangement to stabilize the frequency of the laser.

The detection of the phase change for use as a feedback signal is illustrated in FIG. 1. In particular, the optical resonator output is detected from an end of fiber 16 by a conventional optical detector 20, which converts the detected signal to the electrical domain. The electrical signal is amplified in a conventional amplifier 22, and split at a splitter 24 for input to a first mixer 26 and a second mixer 28. The signal is mixed in mixer 26 with a local oscillator frequency, that can either be the same as the periodic reference signal $\omega_{rf}$ that is input to modulator 14, or a phase locked multiple of the periodic reference signal, i.e., $n\omega_{rf}$ provided by a frequency generator 32. In the event that $n\omega_{rf}$ is used as the local oscillator, switch 34 will be coupled to frequency generator 32 instead of frequency generator 30. By providing a plurality of local oscillators, the system can be reconfigured to lock on a desired sideband instead of the carrier frequency $\omega_0$.

The local oscillator signal is split in a splitter 36 for input to mixer 26 and to a 90° phase shifter 38, prior to input to mixer 28. In this manner, the output of mixer 26 will produce a signal equivalent to A sin$\phi$ and mixer 28 will output a signal equivalent to A cos$\phi$.

When the center frequency of laser 10 (or a selected sideband) overlaps the grating resonance, the phase relation of $\omega_0$ changes in relation to $\omega_0 + n\omega_{rf}$. This phase change is detected by the RF mixers 26, 28 and output, as noted above, as A sin$\phi$ and A cos$\phi$. The phase is recovered in a conventional manner by control circuitry 40 as $$\phi = \tan^{-1}\left(\frac{A\sin\phi}{A\cos\phi}\right).$$

Circuitry 40 provides a wavelength control signal to laser 10 based on the phase shift detected by the heterodyne detector. The laser wavelength control can be accomplished by any of various well known means. For example, if laser 10 is a DFB laser, the output from wavelength control circuitry 40 will control the bias or temperature of the laser to adjust the laser output wavelength. If a semiconductor laser is used, then the input current is increased to increase the wavelength and the input current is decreased to shorten the laser wavelength.

In the event the laser output frequency shifts, a corresponding + or − signal will be output to increase or decrease the laser wavelength as necessary to maintain the laser at the desired wavelength. The implementation of such a system is facilitated by the bipolar nature of the phase shift at resonance, as illustrated in FIG. 4.

It should now be appreciated that the present invention provides a frequency stabilized optical signal source in which a phase shift and/or amplitude change provided by a resonator is detected and used as a feedback mechanism. The provision of an in-fiber resonator, and the preferred embodiment of an in-fiber grating, results in a very low cost and highly reliable feedback arrangement.

The signal source of the present invention can also be used as a precise frequency reference in the optical domain. Such an application would be similar to the well known use of a crystal oscillator in the electrical domain. In order to maintain the stability of the resonator, it can be placed on a silica substrate or provided with temperature control in a well known manner. Still further, a single grating resonator as described herein can be used to reference a plurality of lasers, if each laser is assigned a unique subcarrier modulation frequency.

Although the invention has been described in connection with a specific embodiment thereof, those skilled in the art will appreciate that numerous adaptations and modifications may be made thereto without departing from the spirit and scope of the invention as set forth in the claims.

What is claimed is:

1. A frequency stabilized optical signal source comprising:
   a laser for producing an optical carrier at a wavelength $\lambda$;
   means operatively associated with said laser for adjusting said wavelength $\lambda$;
   means for modulating said optical carrier by a periodic reference signal;
   an optical fiber coupled to receive the modulated optical carrier from said modulating means;
   a resonator within said optical fiber for effecting at least one of a phase and amplitude change between the modulated optical carrier and a sideband thereof at a resonant frequency of said resonator;
   means for detecting one of said phase and amplitude changes; and
   means responsive to said change detecting means for controlling said laser wavelength adjusting means.

2. A signal source in accordance with claim 1 wherein said resonator comprises a moire grating having a single resonant frequency.

3. A signal source in accordance with claim 2 wherein said controlling means lock said adjusting means to maintain $\lambda$ at a wavelength that coincides with the resonant frequency of said grating.

4. A signal source in accordance with claim 1 wherein said detecting means comprise:
   a heterodyne detector in which a signal representative of said modulated optical carrier is mixed with a local oscillator frequency to produce a signal indicative of said phase change.

5. A signal source in accordance with claim 4 wherein said periodic reference signal is used as local oscillator frequency.

6. A signal source in accordance with claim 4 wherein said local oscillator frequency is a phase locked multiple of said periodic reference signal.

7. A signal source in accordance with claim 1 wherein said detecting means detect said change by identifying a unique signature produced thereby at said resonant frequency.

8. A signal source in accordance with claim 1 wherein said controlling means lock said adjusting means to maintain $\lambda$ at a wavelength where the frequency of said sideband coincides with the resonant frequency of said resonator.

9. A signal source in accordance with claim 8 comprising:
   a plurality of local oscillators for providing different frequencies; and
   means for coupling a selected local oscillator to said detecting means;
   wherein the selection of a local oscillator determines which sideband of the modulated optical carrier is used to maintain said wavelength $\lambda$.

10. A signal source in accordance with claim 1 further comprising:
    means for splitting said optical carrier into a first portion for input to said modulating means and a second portion for use as a stable optical signal.

11. A signal source in accordance with claim 10 wherein said second portion comprises a substantial majority of the optical carrier power.

12. A signal source in accordance with claim 11 wherein said resonator comprises a moire grating having a single resonant frequency.

13. A signal source in accordance with claim 12 wherein said controlling means lock said adjusting means to maintain $\lambda$ at a wavelength that coincides with the resonant frequency of said grating.

14. A signal source in accordance with claim 12 wherein said controlling means lock said adjusting means to maintain $\lambda$ at a wavelength where the frequency of said sideband coincides with the resonant frequency of said resonator.

15. A signal source in accordance with claim 1 wherein said modulating means comprise a phase modulator.

* * * * *